United States Patent
Mertens et al.

(10) Patent No.: US 8,901,669 B2
(45) Date of Patent: Dec. 2, 2014

(54) METHOD OF MANUFACTURING AN IC COMPRISING A PLURALITY OF BIPOLAR TRANSISTORS AND IC COMPRISING A PLURALITY OF BIPOLAR TRANSISTORS

(75) Inventors: Hans Mertens, Leuven (BE); Johannes Theodorus Marinus Donkers, Valkenswaard (NL); Evelyne Gridelet, Omal (BE); Tony Vanhoucke, Bierbeek (BE); Petrus Hubertus Cornelis Magnee, Malden (NL)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/560,517

(22) Filed: Jul. 27, 2012

(65) Prior Publication Data

US 2013/0032891 A1  Feb. 7, 2013

(30) Foreign Application Priority Data

Aug. 2, 2011 (EP) ..................... 11176278

(51) Int. Cl.
*H01L 29/66* (2006.01)

(52) U.S. Cl.
USPC ............ 257/378; 257/197; 257/205; 257/370

(58) Field of Classification Search
USPC .................................. 257/197, 205, 370, 378
See application file for complete search history.

(56) References Cited

U.S. PATENT DOCUMENTS

| | | | |
|---|---|---|---|
| 3,959,039 A | 5/1976 | Bonis et al. | |
| 7,105,399 B1 | 9/2006 | Dakshina-Murthy et al. | |
| 7,576,406 B2 * | 8/2009 | Tamaki et al. | 257/526 |
| 7,576,409 B1 | 8/2009 | Chen et al. | |
| 2004/0135137 A1 | 7/2004 | Freeman | |
| 2006/0138460 A1 | 6/2006 | Sasaki et al. | |
| 2009/0014838 A1 | 1/2009 | Arai et al. | |
| 2010/0019326 A1 | 1/2010 | Knoll et al. | |
| 2012/0001192 A1 | 1/2012 | Fox et al. | |

FOREIGN PATENT DOCUMENTS

| | | | |
|---|---|---|---|
| JP | 62-221146 | * | 9/1987 |
| JP | 62-221146 A | | 9/1987 |
| JP | 9-092740 | * | 4/1997 |
| WO | 03/100845 A1 | | 12/2003 |
| WO | 2008/016650 A2 | | 2/2008 |
| WO | 2010/066630 A1 | | 6/2010 |

OTHER PUBLICATIONS

Huizing, H.G.A., et al. "Base Current Tuning in SiGe HBT's by SiGe in the Emitter," IEEE Int'l. Electron Devices Tech. Dig., pp. 899-902 (2001).

(Continued)

*Primary Examiner* — Tan N Tran

(57) ABSTRACT

A method of manufacturing an integrated circuit comprising bipolar transistors including first and second type bipolar transistors, the method comprising providing a substrate comprising first isolation regions each separated from a second isolation region by an active region comprising a collector impurity of one of the bipolar transistors; forming a base layer stack over the substrate; forming a first emitter cap layer of a first effective thickness over the base layer stack in the areas of the first type bipolar transistor; forming a second emitter cap layer of a second effective thickness different from the first effective thickness over the base layer stack in the areas of the second type bipolar transistor; and forming an emitter over the emitter cap layer of each of the bipolar transistors. An IC in accordance with this method.

16 Claims, 9 Drawing Sheets

(56) References Cited

OTHER PUBLICATIONS

McKinnon, W. R., et al. "Emitter Interface in InP-Based HBTs with InAlAs/InP Composite Emitters," IEICE Trans. Electron., vol. E84-C, No. 10, pp. 1373-1378 (Oct. 2001).

Donkers, J.J.T.M., et al. "Metal Emitters SiGe: C HBTs," IEEE Int'l. Electron Devices Meeting Tech. Dig., pp. 243-246 (2004).

Barblat, B., et al. "Carbon Effect on Neutral Base Recombination in High-Speed SiGeC HBTs," Proc. 3d Int'l. SiGe Technology and Device Meeting, pp. 238-239 (2006).

Extended European Search Report for patent appl. No. 11176278.7 (Jan. 16, 2012).

* cited by examiner

METHOD OF MANUFACTURING AN IC COMPRISING A PLURALITY OF BIPOLAR TRANSISTORS AND IC COMPRISING A PLURALITY OF BIPOLAR TRANSISTORS

CROSS-REFERENCE TO RELATED APPLICATIONS

This application claims the priority under 35 U.S.C. §119 of European patent application no. 11176278.7, filed on Aug. 2, 2011, the contents of which are incorporated by reference herein.

FIELD OF THE INVENTION

The present invention relates to manufacturing an integrated circuit comprising a plurality of bipolar transistors including first type and second type bipolar transistors, the method comprising providing a substrate comprising a plurality of first isolation regions each separated from a second isolation region by an active region comprising a collector impurity of one of said bipolar transistors and forming a base layer stack over said substrate.

The present invention further relates to an IC manufactured in this manner.

BACKGROUND OF THE INVENTION

Nowadays, many electronic devices incorporate functionality that operates at radio frequencies, such as mobile communication devices. The implementation of such functionality in a cost-effective manner is far from trivial. It is well-known that bipolar transistors are particularly suitable for handling signals in the radio frequency (RF) domain. However, the manufacture of integrated circuits (ICs) based on silicon bipolar transistor technology is more costly than for instance complementary metal oxide semiconductor (CMOS) ICs, and the downscaling of the device feature size is more easily achieved in CMOS technology. The cost-effective nature of CMOS technology has led to the acceptance of CMOS technology as the mainstream technology of choice for the manufacture of a wide variety of semiconductor components including ICs.

However, the breakdown characteristics of CMOS transistors limit the usefulness of CMOS transistors in RF applications unless costly measures are implemented in the CMOS process to improve these characteristics. Such costly measures typically prohibit the use of RF-CMOS technologies for manufacturing small volume devices such as analog mixed signal (AMS) devices. For these reasons, efforts have been made to produce bipolar transistors using a CMOS process flow, thereby providing mixed technology ICs in which bipolar transistors can be used for handling RF signals. An example of such an IC is provided in WO2010/066630 A1.

The challenge that process developers face is that the number of alterations to the CMOS process should remain small whilst at the same time yielding good quality bipolar transistors that are capable of handling high frequency signals. An example of a low-complexity IC including a heterojunction bipolar transistor formed in a CMOS process flow can for instance be found in WO 2003/100845 A1.

An example of such a bipolar transistor is shown in FIG. 1, and comprises a silicon substrate 10 including an active region 11 in which the collector of the bipolar transistor is formed, e.g. by provision of a buried layer in the substrate 10 or by implantation of an impurity into the substrate 10. The active region 11 is defined in between isolation regions 12, e.g. shallow trench isolation (STI) regions. The bipolar transistor further comprises a layer stack including an epitaxially grown base layer, which grows as a monocrystalline region 14 over the silicon substrate 10 and as a polycrystalline region 14' over the isolation regions 12. A nitride layer (not shown) may be present on the isolation regions 12 to promote epitaxial growth of the base layer portion 14'. A polysilicon base contact layer 16 is present on the base layer, which is covered by an electrically insulating layer 18. An emitter window 28 is defined over the active region 11, in which an emitter material 24 is formed, e.g. As-doped polysilicon, which is electrically insulated from the base contact layer 16 by sidewall spacers 22 in the emitter window 28 and by the electrically insulating layer 18 for the emitter material 24 deposited outside the emitter window 28, e.g. the emitter contact. The emitter material 24 is electrically insulated from the intrinsic base region 14 by further electrically insulation portions 20. The outdiffusion 26 of the emitter 24 is surrounded by these portions 20.

A complication in such mixed CMOS and bipolar transistor devices occurs when the device requires bipolar transistors for different purposes, such as high frequency as well as high voltage application domains. The optimized design parameters of a bipolar transistor for high frequency applications tend to differ from the optimized design parameters of a bipolar transistor for high voltage applications, as the increase in current gain that is desirable for high frequency applications, as it enables high cut-off frequencies and improved noise performance, is typically accompanied by a reduction in breakdown voltage, i.e. the open-base breakdown voltage $BV_{CEO}$, due to the increased collector current density, which is highly undesirable in high voltage applications. There is therefore a need for a manufacturing method and IC in which this problem can be addressed.

SUMMARY OF THE INVENTION

The present invention seeks to provide a method for manufacturing an IC comprising bipolar transistors optimized for high frequency and high voltage applications respectively.

The present invention seeks to provide an IC comprising bipolar transistors optimized for high frequency and high voltage applications respectively.

According to a first aspect of the present invention, there is provided a method of manufacturing an integrated circuit comprising a plurality of bipolar transistors including a first type bipolar transistor and a second type bipolar transistor, the method comprising providing a substrate comprising a plurality of first isolation regions each separated from a second isolation region by an active region comprising a collector impurity of one of said bipolar transistors; forming a base layer stack over said substrate; forming a first emitter cap layer of a first effective thickness over the base layer stack in the areas of the first type bipolar transistor; forming a second emitter cap layer of a second effective thickness different to the first effective thickness over the base layer stack in the areas of the second type bipolar transistor; and forming an emitter over the emitter cap layer of each of said bipolar transistors.

The present invention is based on the insight that by tuning the effective thickness of the emitter cap layer that vertically separates the base from the emitter, the collector current of the heterojunction bipolar transistor can be tuned over a wide range, e.g. up to a factor 7. An increase in effective thickness increases the thickness of the part of the emitter cap layer that forms part of the base, i.e. the part of the emitter cap layer that is not doped by the impurities in the emitter material deposited over the emitter cap layer, e.g. in an anneal or activation step. Consequently, by tuning the thickness of the emitter cap layer, the performance characteristics of the different types of heterojunction bipolar transistors, e.g. bipolar transistors for high frequency applications and bipolar transistors for high voltage applications can be individually tuned.

Such individual tuning may be established in a number of ways.

In an embodiment, the steps of forming an emitter cap layer of a first effective thickness and a second effective thickness comprise simultaneously growing the first emitter cap layer and the second emitter cap layer to a first thickness; selectively forming an epitaxial growth inhibiting layer over the first emitter cap layer; epitaxially growing the second emitter cap layer to a second thickness; and removing the epitaxial growth inhibiting layer from over the first emitter cap layer. As growth rates of e.g. epitaxially grown Si layers can be accurately controlled, it is possible to accurately control the relative thickness of the first and second emitter cap layers at the cost of a single additional mask in the manufacturing process for selectively forming the epitaxial growth inhibiting layer such as an oxide layer.

Alternatively, the method further comprises selectively forming an epitaxial growth inhibiting layer over the base layer stack in the areas of the first type bipolar transistor, and wherein the steps of forming the first emitter cap layer and the second emitter cap layer comprise epitaxially growing the second emitter cap layer over the base layer stack in an area of a second type bipolar transistor to an intermediate thickness; removing the epitaxial growth inhibiting layer; and simultaneously growing the first emitter cap layer to a first thickness and the second emitter cap layer to a second thickness, which also has the advantage of being able to accurately control the relative thickness of the first and second emitter cap layers at the cost of a single additional mask in the manufacturing process.

In another embodiment, the steps of forming the first emitter cap layer and the second emitter cap layer comprise simultaneously forming the first emitter cap layer and the second emitter cap layer to a second thickness; selectively oxidizing the first emitter cap layer up to a first thickness; and removing the oxidized part of the first emitter cap layer. This has the advantage that the emitter cap layers can be grown in a single step. This may be achieved by providing a patterned oxidation protection mask over the second emitter cap layer prior to said selective oxidation step; and removing the patterned oxidation protection mask following said selective oxidation step, in which case a single additional mask is required in the manufacturing process for patterning the oxidation protection layer which for instance may be a nitride layer.

Alternatively, this may be achieved by the method further comprising between said simultaneously forming step and said selectively oxidizing step forming a further layer stack over the first emitter cap layer and the second emitter cap layer; forming a plurality of emitter windows in said further layer stack, exposing the first emitter cap layers and the second emitter cap layers; lining said emitter windows with a nitride layer; selectively implanting a SIC impurity into the active region of the first type of bipolar transistor through a mask; and selectively removing the nitride layer from the emitter windows over said first emitter caps using said mask. This embodiment has the advantage that no additional mask is required as the SIC implant mask is reused for the selective removal of the nitride layer.

In yet another embodiment of the present invention, the steps of forming the first emitter cap layer and the second emitter cap layer comprise simultaneously forming the first emitter cap layer and the second emitter cap layer to a second thickness; forming a further layer stack over the first emitter cap layer and the second emitter cap layer; forming a plurality of emitter windows in said further layer stack, exposing the first emitter cap layers and the second emitter cap layers; masking the emitter windows of the second type of bipolar transistors; and implanting an impurity into an upper region of the first emitter cap layers to reduce the effective thickness of the first emitter cap layers to the first effective thickness. This embodiment relies on converting part of the emitter cap layer into an emitter layer portion by implanting an impurity such as arsenic into part of the emitter cap layer.

This may be achieved by the masking step comprising depositing a patterned resist layer covering the second emitter cap layers. Alternatively, said masking step may comprise lining said emitter windows with a nitride layer; selectively implanting the impurity into the first emitter caps through a mask; and selectively removing the nitride layer from the emitter windows over said first emitter caps using said mask. This again has the advantage that no additional masks are required to differentiate the thickness of the emitter cap layers of the different type of heterojunction bipolar transistors.

Preferably, the step of forming the base layer stack comprises forming a buffer layer over the substrate and forming a carbon-doped SiGe layer over the buffer layer.

According to another aspect of the present invention, there is provided an integrated circuit having a substrate comprising a plurality of bipolar transistors including a first type bipolar transistor and a second type bipolar transistor; the first type bipolar transistor comprising a collector region formed in an active region in between adjacent insulation regions in the substrate, a base layer stack over said active region and an emitter separated from said base layer stack by a first emitter cap layer of a first effective thickness; and the second type bipolar transistor comprising a collector region formed in an active region in between adjacent insulation regions in the substrate, a base layer stack over said active region and an emitter separated from said base layer stack by a second emitter cap layer of a second effective thickness different to the first effective thickness. Such an IC has the advantage that it comprises individually optimized bipolar transistors for different types of applications in a single substrate, thus improving the performance of the IC in general and of the bipolar transistors in particular.

Preferably, the first type bipolar transistor comprises a collector profile that is different to the collector profile of the second type of bipolar transistor. This further improves the individualized optimization of the performance of each type of bipolar transistor for its chosen application domain.

In an embodiment, the emitter of the first type of bipolar transistor comprises an first impurity profile extending from the base layer and a second impurity profile of an opposite impurity type extending from the first impurity profile to the emitter, such that the first impurity profile has the first thickness.

Typically, the substrate further comprises a plurality of complementary metal oxide semiconductor field effect transistors, as the various embodiments of the present invention are particularly suited to forming heterojunction bipolar transistors in a CMOS manufacturing process.

BRIEF DESCRIPTION OF THE EMBODIMENTS

Embodiments of the invention are described in more detail and by way of non-limiting examples with reference to the accompanying drawings, wherein:

FIG. 1 schematically depicts a design of a prior art heterojunction bipolar transistor;

Figure 5:
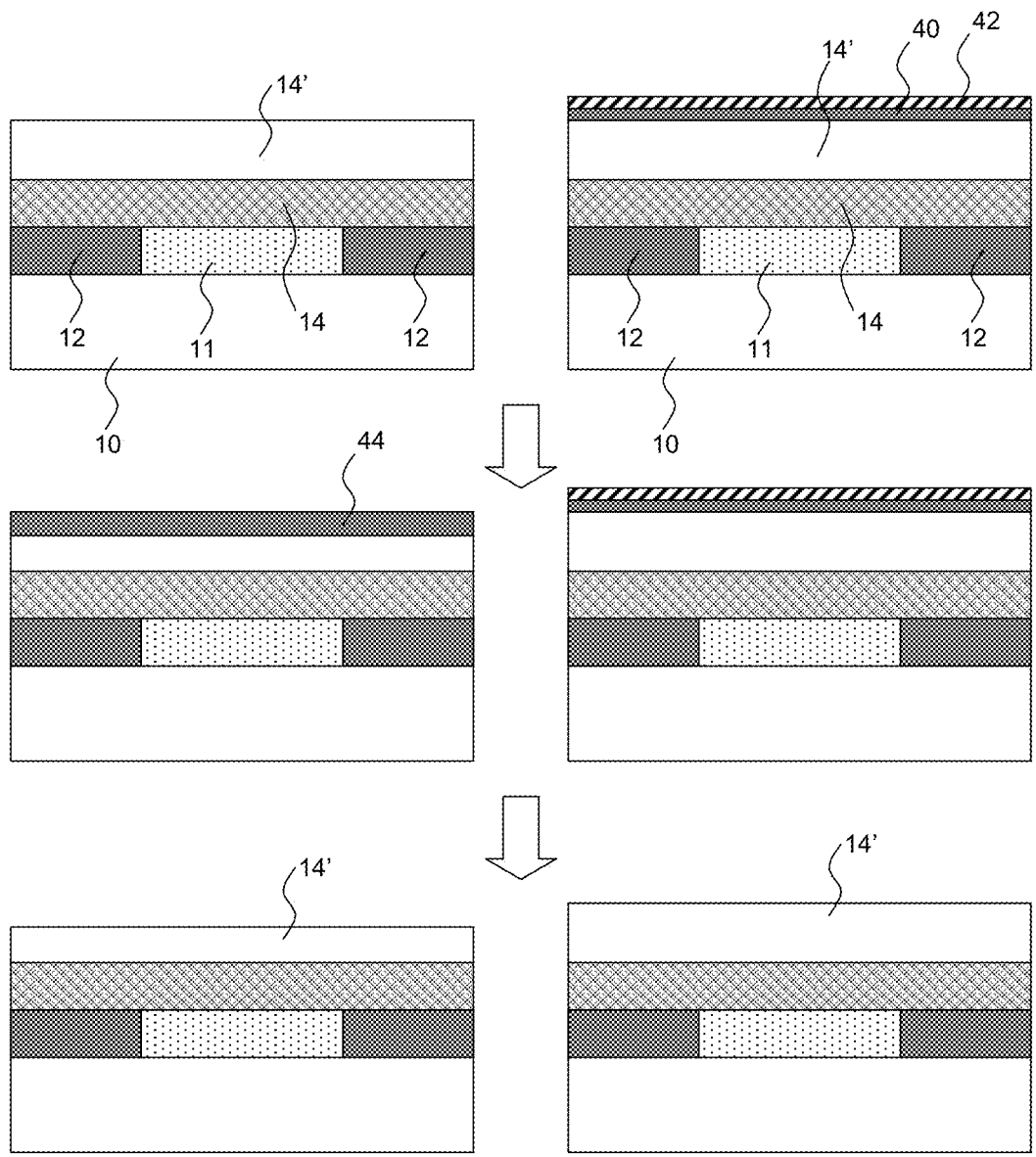
Figure 6:
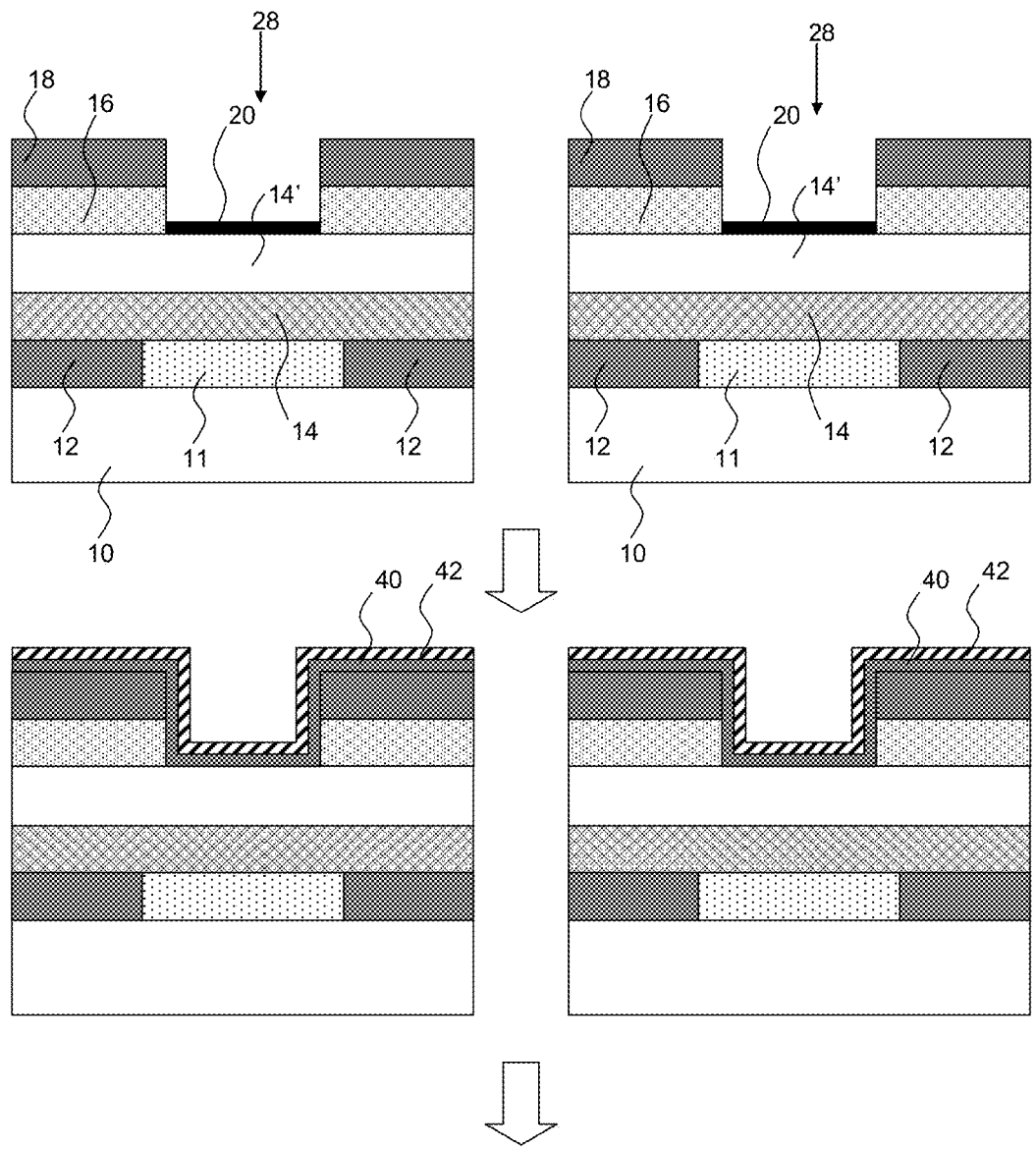
Figure 6:
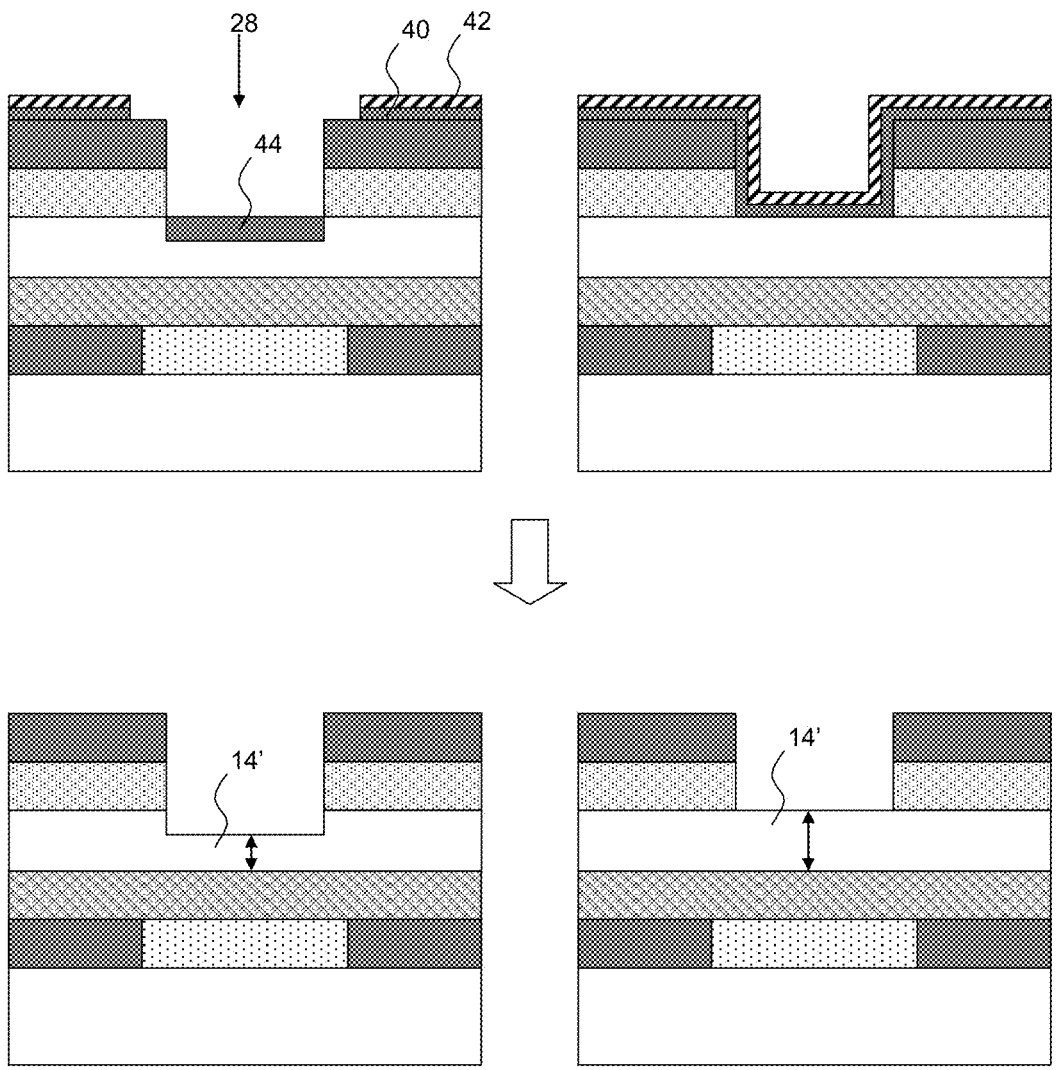
Figure 7:
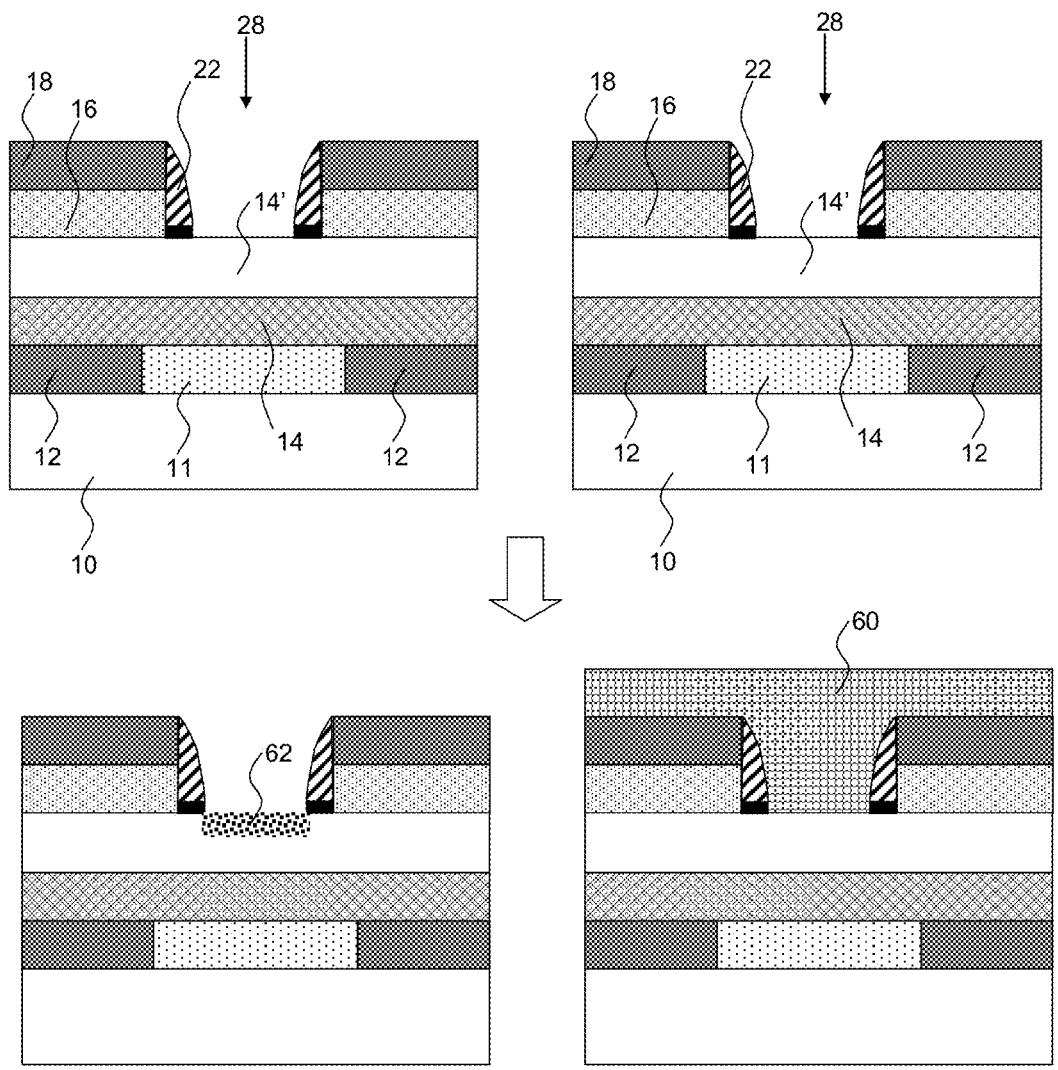
Figure 8:
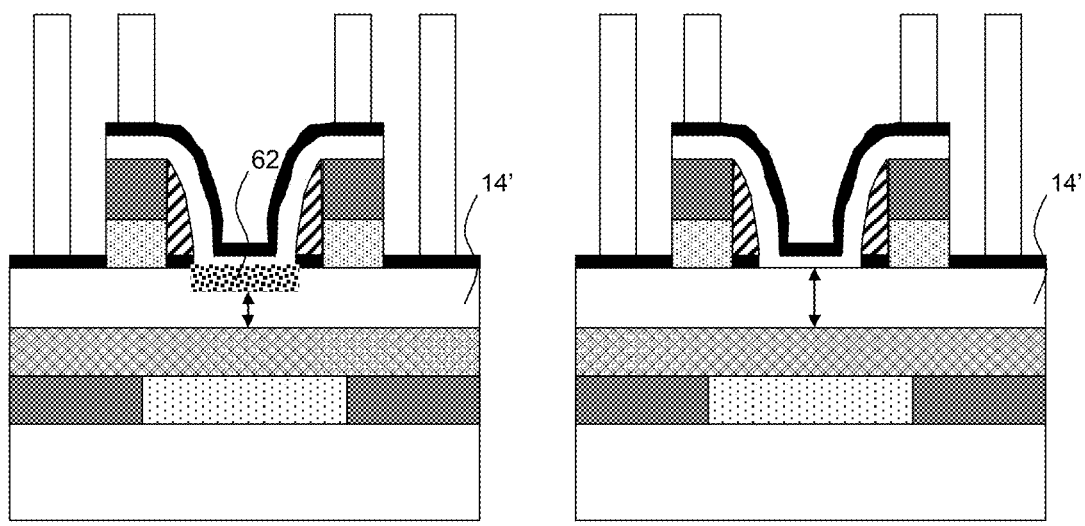

FIG. 4-7 schematically depict various embodiments of the method of the present invention; and FIG. 8 depicts an IC comprising different types of heterojunction bipolar transistors obtained with the method of FIG. 7.

DETAILED DESCRIPTION OF THE DRAWINGS

It should be understood that the Figures are merely schematic and are not drawn to scale. It should also be understood that the same reference numerals are used throughout the Figures to indicate the same or similar parts.

The method of the present invention may be applied to the manufacture of any suitable bipolar transistor. An embodiment of the manufacturing method of the present invention will now be explained in more detail for a particular heterojunction bipolar transistor by way of non-limiting example only. The skilled person will understand that the principles of the present invention may be applied to any bipolar transistor design that comprises a vertical layer stack in which an emitter is laterally separated from a polysilicon base layer, as will become apparent from the following description.

In the context of the present application, the term 'type of bipolar transistor' refers to a bipolar transistor having a particular layout or construction, which has been chosen based on the application domain in which the bipolar transistor is to operate. Typically, when referring to a different type of bipolar transistor, reference is made to bipolar transistors realized in the same technology, i.e. in the same semiconductor substrate, for which different operational parameters have been achieved by way of design variations between the bipolar transistors.

Figure 1:
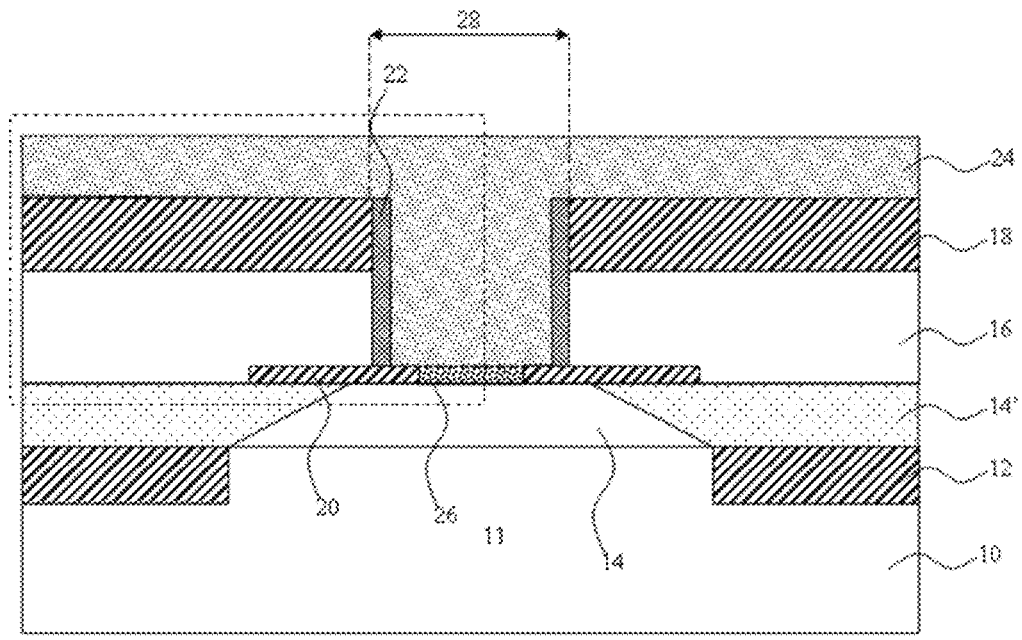

It has been realized that in heterojunction bipolar transistors (HBTs) such as the device shown in FIG. 1, the base-emitter profiles of high voltage and high frequency HBTs in a single BiCMOS technology are typically identical, such that optimization of the vertical base-emitter profile for one application domain negatively affects the other application domain. For instance, vertical downscaling of the base-emitter profile in order to reach high collector current densities leading to high cut-off frequencies and good noise performance for a high-speed HBT negatively affects the breakdown voltage $BV_{CEO}$ if the same base-emitter stack in combination with a different collector is to be used as a high-voltage device due to the fact that the increase in collector current density leads to an increase in DC current gain if the base current density is not increased as well. Increasing the base current density is far from trivial, for instance because base current enhancement also increases 1/f noise, and may also affect high frequency noise characteristics. In addition, there are no readily available techniques for increasing the base current density that can be applied on an industrial scale.

For this reason, the present invention is based on the realization that collector current density may be tuned by variation of the vertical width of the base, i.e. the thickness of the base between the collector region and the emitter. In particular, the present invention provides embodiments of a manufacturing method in which the base width may be varied between different types of HBTs with minimal additional processing steps, thus making the method of the present invention commercially attractive due to its minimal cost implications.

Figure 2:
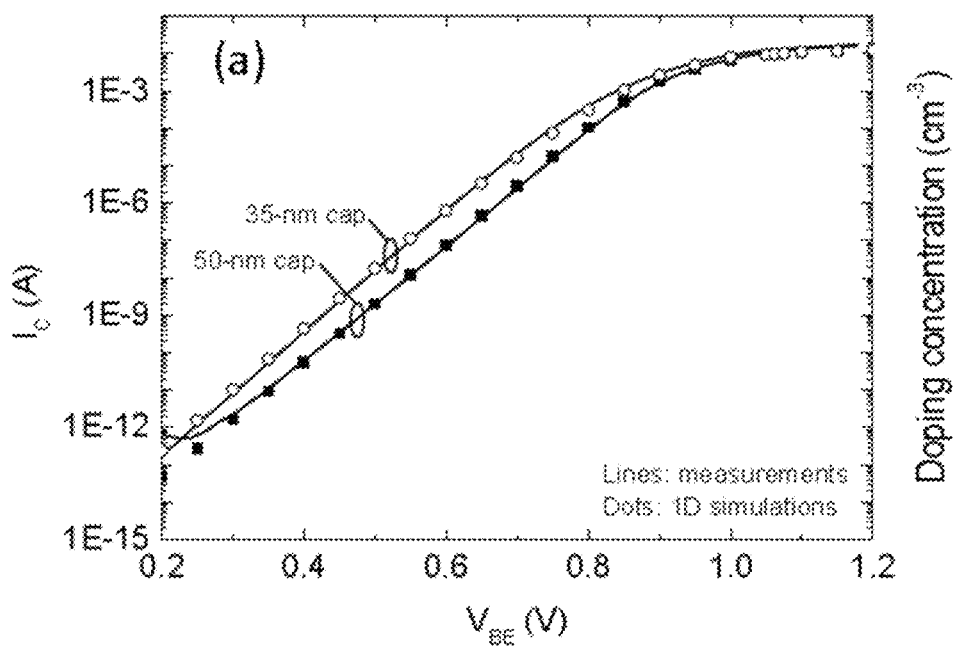
FIG. 2 shows a graph demonstrating the principles of the present invention.
Figure 3:
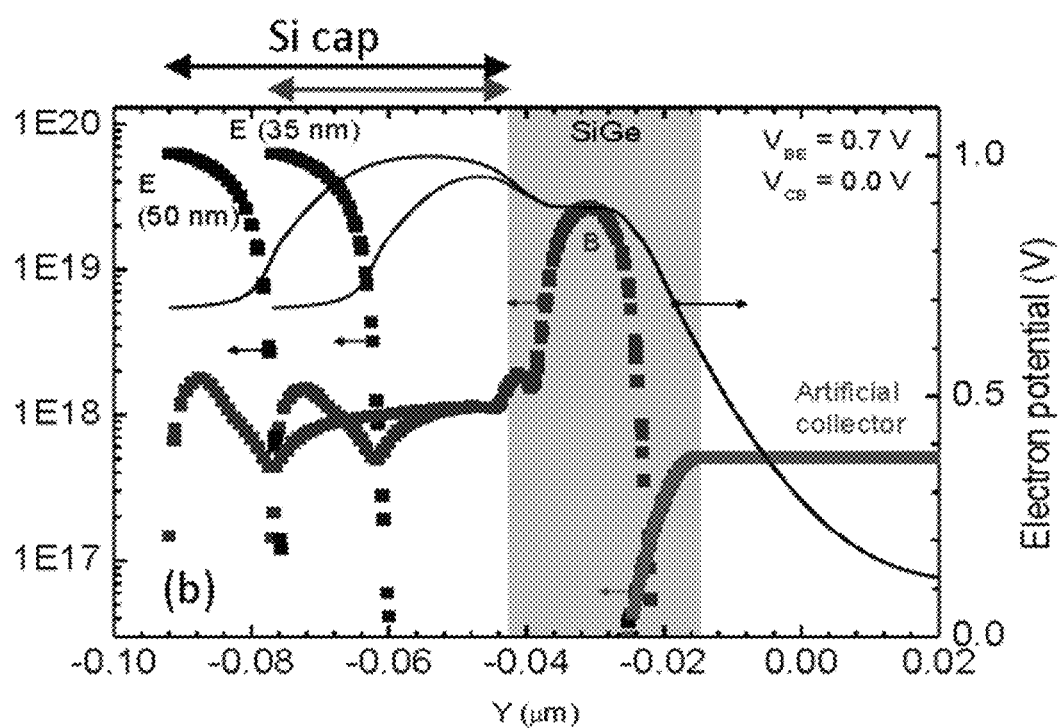
FIG. 3 shows a graph demonstrating the an impurity profile of a heterojunction bipolar transistor used in the simulations shown in FIG. 2.

The concept of the present invention is demonstrated in FIGS. 2 and 3. FIG. 2 shows that, for two different thicknesses of a so-called silicon emitter cap, which is the silicon layer that is epitaxially grown on top of a base layer such as a SiGe:C layer, the collector current of the SiGe:C HBT under consideration is modified considerably, i.e. by a factor 7 in the ideal range. This translates into a DC current gain modification by the same factor for a fixed base current. FIG. 3 explains the origin of the difference in collector current. The electron potential in the base, which depends on both the doping concentration and the band gap of the host material, is both relatively wide and high for the transistor with the thick emitter cap, because in this case a larger part of the emitter cap contributes to the base, i.e. the part that is not overdoped by the arsenic from the emitter such as a polysilicon emitter that is deposited on top of the emitter cap. The larger band gap of silicon with respect to SiGe explains the higher electron potential in the silicon despite the lower boron concentration (grey dots). The collector current could be further increased if the thickness of the emitter cap is reduced further from 35 nm to 20-25 nm. In that way, the parasitic potential barrier can be eliminated completely.

This example shows that collector current density of high-voltage devices could in principle be made smaller than the collector current density of the high-speed devices by implementing a thicker emitter cap for the high-voltage devices compared to the high-speed devices, e.g. 50 nm versus 35 nm. In practice, this can be done in multiple ways.

In the following figures, various non-limiting examples of embodiments of the present invention will be described in more detail. In these figures, two types of bipolar transistors to be present in a single semiconductor substrate or die are shown adjacent to each other. For instance, the left hand bipolar transistor may provide an example of a transistor to be optimized for high frequency applications whereas the right hand bipolar transistor may provide an example of a transistor to be optimized for high voltage applications.

Figure 4:
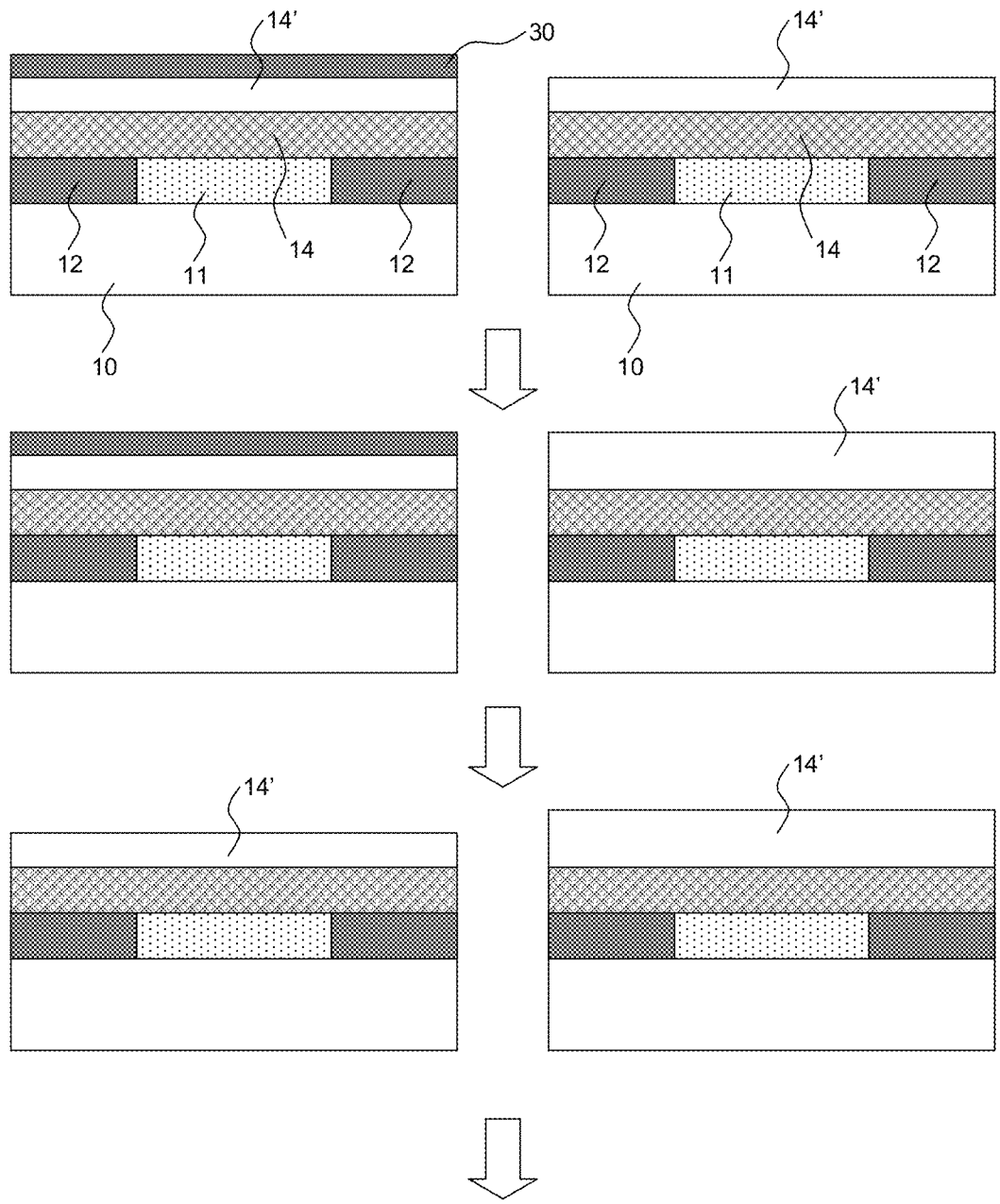
Figure 4:
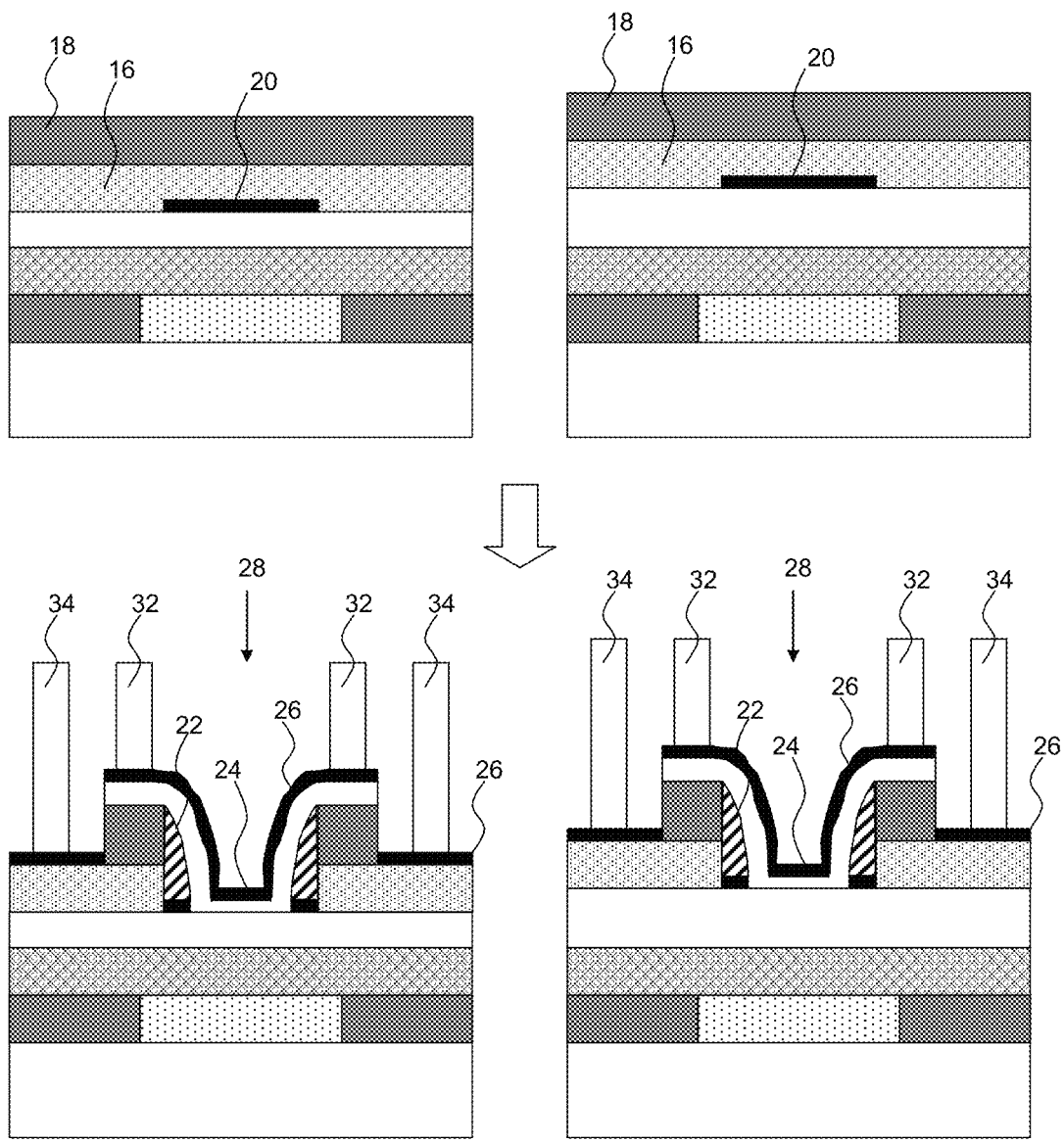

A first embodiment of the method of the present invention is shown in FIG. 4. A substrate 10 including an active region 11 in between isolation regions 12 such as shallow trench isolation regions is provided for both types of HBT formed in this substrate 10. The active region typically comprises a collector region, e.g. a buried collector formed by a buried layer grown epitaxially in the substrate 10 or an implanted collector. Any suitable implementation of the collector may be contemplated. The collector may be optimized for the type of HBT, e.g. by using selectively implanted collector regions under the intrinsic base of certain types of bipolar transistors to retard the on-set of the base push-out (also known as the Kirk effect), different impurity profiles for different types of HBT to tune the collector characteristics in accordance with the requirements of the desired application domain. This may for instance be achieved by using different mask sets for the formation of the collector regions of the different types of bipolar transistors.

A patterned nitride layer (not shown) may optionally be formed over the isolation regions 12, whilst leaving exposed the active region 11. On this structure, a base layer stack 14 may be epitaxially grown, resulting in monocrystalline base layer portions growing on the exposed regions of the monocrystalline substrate 10 including the active region 11 and polycrystalline base layer portions on amorphous or polycrystalline surfaces such as the isolation regions 12 or the nitride layer over the isolation regions 12 if present.

In a preferred embodiment, the base layer stack 14 comprises a Si/SiGe:C layer stack, which by way of non-limiting example may be formed as follows. Prior to the growth of the epitaxial base layer, the exposed silicon surfaces may be passivated by a hydrogen bake. The base layer is formed by first growing an undoped Si buffer layer, followed by the growth of an undoped SiGe:C collector-base spacer, a boron-doped SiGe:C base and an undoped SiGe:C base-emitter spacer. The base layer stack 14 is typically completed by a Si emitter cap 14', which is grown to a first thickness, e.g. 35 nm, for both bipolar transistors. As will be readily understood by the skilled person, the emitter cap layer 14' forms an extension of the base of the bipolar transistor and is therefore typically doped with the same type of impurity as the base layer 14, e.g. a p-type impurity for a NPN transistor or a n-type impurity for a PNP transistor. The carbon content in the SiGe layers preferably is around 0.2% and the germanium content is preferably around 20% in these layers. The carbon in the SiGe:C layers prevents the outdiffusion of boron impurities from the boron-doped base, as is known per se. However, it should be understood that the exact composition and structure of the base in the bipolar transistor of the present invention is not important; any suitable base construction may be chosen.

In accordance with an embodiment of the present invention, the emitter cap 14' of one of the transistor types is protected by a dielectric layer 30 to inhibit the epitaxial growth of silicon on the emitter cap 14. A suitable embodiment of the layer 30 is $SiO_2$ or a similar oxide. Such a pattern of dielectric layers 30 may be achieved by the addition of a non-critical mask to the mask set of the manufacturing process of the IC comprising the bipolar transistors.

As shown in the next step, the emitter cap 14 of the type of bipolar transistor not protected by the dielectric layer 30 is subsequently grown to a second thickness, e.g. 50 nm, after which the dielectric layer 30 is removed from the first type of bipolar transistors in any suitable manner, e.g. using a wet etch such as a HF etch, leading to the first type of bipolar transistors shown on the left hand side of FIG. 4 having an emitter cap 14' of a first thickness and the second type of bipolar transistors shown on the right hand side of FIG. 4 having an emitter cap 14' of a second thickness that is different to, e.g. larger than, the first thickness.

After the formation of the emitter caps 14' of different thicknesses for the different types of bipolar transistors of the IC under manufacture, the bipolar transistor may be finalized in any suitable manner. For instance, a region of the base layer stack may be protected by an etch stop layer portion 20, after which a polysilicon base contact layer 16 and a dielectric layer 18 such as a TEOS layer may be grown over the base layer stack 14 including the emitter cap layer 14'. The TEOS layer electrically insulates the base contact layer from the emitter contact.

An emitter window 28 may be formed in the polysilicon base contact layer 16 stopping on the etch stop layer portion 20, after which sidewall spacers 22, e.g. oxide sidewall spacers or oxide-nitride-oxide (ONO) sidewall spacers are formed inside the emitter window 28, followed by the formation of a doped emitter layer 24 over the resulting structure. Part of the base contact layer 16 is subsequently exposed and the exposed part of the base contact layer 16 and the emitter layer 16 is converted into silicide 32, after which emitter contacts 34 and base contacts 36 are formed. It is reiterated that the above process flow for finishing the bipolar transistors after formation of the emitter cap 14' is shown by way of non-limiting example only, and that any suitable alternative process steps to finish the bipolar transistors may be chosen.

In addition, it is noted that instead of forming the dielectric layer portion 30 on the first type of bipolar transistor after forming the emitter cap 14' to a first thickness, it is equally feasible to form the dielectric layer portion 30 on the first type of bipolar transistor prior to formation of the emitter cap 14', i.e. on the base layer stack 14. In this embodiment, the emitter cap 14' is selectively grown on the second type of bipolar transistor to an intermediate thickness $T(i)=T2-T1$, in which T2 is the second thickness, i.e. the intended thickness of the emitter cap 14' on the second type of bipolar transistor, and T1 is the intended thickness of the emitter cap 14' on the first type of bipolar transistor. The dielectric layer portion 30 is subsequently removed, e.g. by a wet etch such as a HF etch, after which the emitter cap 14' on the first type of bipolar transistor is grown to T1, and the thickness of the emitter cap 14' on the second type of transistor is grown from $T(i)$ to $T(i)+T1$, which equals T2.

An alternative embodiment to tune the thickness of the silicon emitter cap 14' is shown in FIG. 5. Again, the substrate 10 includes active (collector) regions 11 in between isolation regions 12 such as shallow trench isolation regions is provided for both types of HBT formed in this substrate 10. On this structure, a base layer stack 14 may be epitaxially grown, resulting in monocrystalline base layer portions growing on the exposed regions of the monocrystalline substrate 10 including the active region 11 and polycrystalline base layer portions on amorphous or polycrystalline surfaces such as the isolation regions 12 or the nitride layer over the isolation regions 12 if present. The emitter cap layer 14' is grown to the second thickness, i.e. the larger thickness on both types of bipolar transistors, after which the thickness of the first type of bipolar transistor shown on the left hand side of FIG. 5 is reduced.

To this end, an oxide layer 40 and a nitride layer 42 are formed on the second type of bipolar transistor shown on the right hand side of FIG. 5. This may be achieved by forming the oxide and nitride stack over the whole substrate 10 and selectively removing this stack from the first type of bipolar transistors, thus exposing the emitter cap layer 14' of these transistors only.

The exposed emitter cap layers 14' are subsequently partially oxidized as indicated by layer 44, thereby reducing the thickness of the emitter cap layers 14' of the first type of bipolar transistors. This may for instance be achieved usingrapid thermal oxidation. The oxidation process should be tuned such as to prevent or at least limit enhanced diffusion of impurities, e.g. boron, in the base layer stack 14. The nitride layer 42 is subsequently removed followed by the removal of the oxide layers 40 and 44 from the second type of bipolar transistor and the first type of bipolar transistor respectively, thus yielding different types of bipolar transistor with different emitter cap layer 14' thicknesses, after which the bipolar transistors may be completed as shown in FIG. 4.

An alternative embodiment of the selective emitter cap layer 14' oxidation process utilizes a HBT design in which a selectively implanted collector (SIC) is formed underneath the intrinsic base region after the epitaxial growth of the base layer stack 14 and the emitter cap 14' in the bipolar transistors of the first type, e.g. high speed bipolar transistors. This is shown in FIG. 6, which shows the manufacturing process of an IC comprising different type of bipolar transistors following the opening of the emitter window 28 in the base contact poly 16 and the dielectric layer 18, e.g. TEOS layer 18 over the active region 11, with the emitter cap layer 14' being protected by an etch stop layer portion 20. In this embodiment, the silicon emitter cap layers 14' of both types of bipolar transistors are grown to the second thickness.

In a next step, an oxide layer 40 and a nitride layer 42 stack is formed over the whole substrate 10 and selectively removed together with the etch stop layer 20 from the emitter window 28 of the first type of bipolar transistors only, thus exposing the emitter cap layer 14' of these transistors only.

Next, the exposed emitter cap layers 14' are partially oxidized in the same manner as already explained in the context of FIG. 5, as demonstrated by the oxide layer portion 44 on top of the reduced thickness emitter cap layers 14' of the first type of bipolar transistor shown on the left hand side of FIG. 6, after which the nitride layer 42 is subsequently removed followed by the removal of the oxide layers 40 and 44 from the second type of bipolar transistor and the first type of bipolar transistor respectively, thus yielding different types of bipolar transistor with different emitter cap layer 14' thicknesses at least over the respective active regions 11 of these bipolar transistors as indicated by the double arrows, after which the bipolar transistors may be completed as shown in FIG. 4. The advantage of this embodiment is that the SIC implantation mask can be used for the partial oxidation of the emitter cap layer 14' of the first type of bipolar transistor, such that no additional mask is required to differentiate the thicknesses of the emitter cap layers 14' of the different types of bipolar transistors.

Hence, in the embodiments of FIGS. 5 and 6, the first type of bipolar transistor comprises a silicon emitter cap layer 14' having a region over the active region 11 and the base layer 14 that has a smaller thickness than the thickness of the silicon emitter cap layer 14' of the second type of bipolar transistors in the same location. The thickness of the silicon emitter cap layer 14' in the region over the active region 11 and the base layer 14, i.e. in between the emitter layer 24 and the base layer 14 is also referred to as the effective thickness of the emitter cap layer 14'.

It is equally feasible to alter the effective thickness of the emitter cap layer 14' of one type of bipolar transistor without having to partially remove the emitter cap layer 14'. Instead, the electrical properties of the emitter cap layer 14' may be altered by implanting an impurity into an emitter cap layer 14' having a thickness larger than the first thickness, wherein the implantation depth of the impurity reduces the effective thickness of the emitter cap layer 14' to the first thickness. Preferably, this impurity is the same impurity used to set the properties of the emitter layer 24, such that this part of the emitter cap layer 14' is converted into an extension of the emitter layer 24.

An example of such an embodiment of the present invention is shown in FIG. 7, which depicts the manufacturing process of an IC comprising different type of bipolar transistors following the opening of the emitter window 28 in the base contact poly 16 and the dielectric layer 18, e.g. TEOS layer 18 over the active region 11, with the emitter cap layer 14' being protected by an etch stop layer portion 20, and the subsequent formation of side wall spacers 22 in the emitter window 28 to electrically insulate the emitter layer 24 from the base contact layer 16. In this embodiment, the silicon emitter cap layers 14' of both types of bipolar transistors are grown to the second thickness.

The emitter windows of the second type of bipolar transistors shown on the right hand side of FIG. 7 are subsequently protected by a resist layer 60, after which an impurity 62 is implanted into the exposed emitter cap layers 14' of the first type bipolar transistors shown on the left hand side of FIG. 7. The impurity is implanted to a depth such that the effective thickness of the exposed emitter cap layer 14' is reduced to the first thickness. Examples of suitable impurities will be immediately apparent to the skilled person. For instance, n-type impurities such as arsenic and phosphorous or p-type impurities such as boron may be used.

The resist 60 is subsequently removed after which the bipolar transistors may be completed as shown in FIG. 4 or in any other suitable manner. The resultant structure is shown in FIG. 8, where the reduction in effective thickness of the emitter cap layer 14' for the first type of bipolar transistors by the presence of the implanted impurity 62 in the emitter cap layer 14' is demonstrated by the double arrows indicating the width, i.e. thickness, of the emitter cap layer 14' of each type of bipolar transistor.

In an alternative embodiment, the impurity 62 may be implanted prior to the formation of the sidewall spacers 22, e.g. using the same mask as used for the SIC implant as described in FIG. 6. In this embodiment, the steps as shown in FIG. 6 may be followed with the difference that part of the emitter cap layer 14' is not oxidized but an impurity 62 is implanted into the emitter cap layer 14' instead. This again has the advantage that the SIC implantation mask may be reused for the implantation of the impurity 62, thus yielding a manufacturing method of an IC comprising different types of bipolar transistors for which no additional masks are required.

It is noted at this stage that the IC manufacturing process preferably is a CMOS process in which both MOSFETs and bipolar transistors are integrated into the same IC. Such a process is sometimes also referred to as a BiCMOS process, which typically comprises process steps dedicated to forming aspects of the MOSFETs and process steps dedicated to forming aspects of the bipolar transistors, as well as process steps in which aspects of both MOSFET and bipolar transistors are formed simultaneously.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method of manufacturing an integrated circuit comprising a plurality of bipolar transistors including a first type bipolar transistor and a second type bipolar transistor, the method comprising:
   providing a substrate comprising a plurality of first isolation regions each separated from a second isolation region by an active region comprising a collector impurity of one of said bipolar transistors;
   forming a base layer stack over said substrate;
   forming a first emitter cap layer of a first effective thickness over the base layer stack in the areas of the first type bipolar transistor;
   forming a second emitter cap layer of a second effective thickness different to the first effective thickness over the base layer stack in the areas of the second type bipolar transistor; and
   forming an emitter over the emitter cap layer of each of said bipolar transistors, wherein the first type bipolar transistor comprises a collector profile that is different to the collector profile of the second type of bipolar transistor.

2. The method of claim 1, wherein the steps of forming a first emitter cap layer of a first effective thickness and forming a second emitter cap layer of a second effective thickness comprise:
   simultaneously growing the first emitter cap layer and the second emitter cap layer to a first thickness;
   selectively forming an epitaxial growth inhibiting layer over the first emitter cap layer;
   epitaxially growing the second emitter cap layer to a second thickness; and
   removing the epitaxial growth inhibiting layer from over the first emitter cap layer.

3. The method of claim 1, further comprising selectively forming an epitaxial growth inhibiting layer over the base layer stack in the areas of the first type bipolar transistor, and wherein the steps of forming the first emitter cap layer and the second emitter cap layer comprise:
   epitaxially growing the second emitter cap layer over the base layer stack in an area of a second type bipolar transistor to an intermediate thickness;
   removing the epitaxial growth inhibiting layer; and
   simultaneously growing the first emitter cap layer to a first thickness and the second emitter cap layer to a second thickness.

4. The method of claim 1, wherein the steps of forming the first emitter cap layer and the second emitter cap layer comprise:
   simultaneously forming the first emitter cap layer and the second emitter cap layer to the second thickness;
   selectively oxidizing the first emitter cap layer up to a first thickness; and
   removing the oxidized part of the first emitter cap layer.

5. The method of claim 4, further comprising:
   providing a patterned oxidation protection mask over the second emitter cap layer prior to said selective oxidation step; and
   removing the patterned oxidation protection mask following said selective oxidation step.

6. The method of claim 4, further comprising, between said simultaneously forming step and said selectively oxidizing step:
   forming a further layer stack over the first emitter cap layer and the second emitter cap layer;
   forming a plurality of emitter windows in said further layer stack, exposing the first emitter cap layers and the second emitter cap layers;
   lining said emitter windows with a nitride layer;
   selectively implanting a SiC impurity into the active region of the first type of bipolar transistor through a mask; and
   selectively removing the nitride layer from the emitter windows over said first emitter caps using said mask.

7. The method of claim 1, wherein the steps of forming the first emitter cap layer and forming the second emitter cap layer comprise:
   simultaneously forming the first emitter cap layer and the second emitter cap layer to a second thickness;
   forming a further layer stack over the first emitter cap layer and the second emitter cap layer;
   forming a plurality of emitter windows in said further layer stack, exposing the first emitter cap layers and the second emitter cap layers;
   masking the emitter windows of the second type of bipolar transistors; and
   implanting an impurity into an upper region of the first emitter cap layers to reduce the effective thickness of the first emitter cap layers to the first effective thickness.

8. The method of claim 7, wherein the masking step comprises depositing a patterned resist layer covering the second emitter cap layers.

9. The method of claim 7, wherein said masking step comprises lining said emitter windows with a nitride layer; and further comprising:
   selectively implanting a SiC impurity into the active region of the first type of bipolar transistor through a mask; and
   selectively removing the nitride layer from the emitter windows over said first emitter caps using said mask.

10. The method of claim 1, wherein the step of forming the base layer stack comprises forming a buffer layer over the substrate and forming a carbon-doped SiGe layer over the buffer layer.

11. An integrated circuit having a substrate comprising a plurality of bipolar transistors including a first type bipolar transistor and a second type bipolar transistor;
   the first type bipolar transistor comprising a collector region formed in an active region in between adjacent insulation regions in the substrate, a base layer stack over said active region and an emitter separated from said base layer stack by a first emitter cap layer of a first effective thickness; and
   the second type bipolar transistor comprising a collector region formed in an active region in between adjacent insulation regions in the substrate, a base layer stack over said active region and an emitter separated from said base layer stack by a second emitter cap layer of a second effective thickness different to the first effective thickness, wherein the first type bipolar transistor comprises a collector profile that is different to the collector profile of the second type of bipolar transistor.

12. The integrated circuit of claim 11, wherein the first emitter cap layer of the first type of bipolar transistor comprises a first impurity profile extending from the base layer and a second impurity profile of an opposite impurity type extending from the first impurity profile to the emitter, such that the first impurity profile has the first thickness.

13. The integrated circuit of claim 11, wherein the base layer stack of the first type bipolar transistor or the second type bipolar transistor comprises a carbon-doped SiGe layer, and wherein the first emitter cap layers and the second emitter cap layers comprise a Si layer.

14. The integrated circuit of claim 11, wherein the substrate further comprises a plurality of complementary metal oxide semiconductor field effect transistors.

15. An integrated circuit having a substrate comprising a plurality of bipolar transistors including a first type bipolar transistor and a second type bipolar transistor;
   the first type bipolar transistor comprising a collector region formed in an active region in between adjacent insulation regions in the substrate, a base layer stack over said active region and an emitter separated from said base layer stack by a first emitter cap layer of a first effective thickness; and
   the second type bipolar transistor comprising a collector region formed in an active region in between adjacent insulation regions in the substrate, a base layer stack over said active region and an emitter separated from said base layer stack by a second emitter cap layer of a second effective thickness different to the first effective thickness, wherein the first emitter cap layer of the first type of bipolar transistor comprises a first impurity profile extending from the base layer and a second impurity profile of an opposite impurity type extending from the first impurity profile to the emitter, such that the first impurity profile has the first thickness.

16. An integrated circuit having a substrate comprising a plurality of bipolar transistors including a first type bipolar transistor and a second type bipolar transistor;

the first type bipolar transistor comprising a collector region formed in an active region in between adjacent insulation regions in the substrate, a base layer stack over said active region and an emitter separated from said base layer stack by a first emitter cap layer of a first effective thickness; and the second type bipolar transistor comprising a collector region formed in an active region in between adjacent insulation regions in the substrate, a base layer stack over said active region and an emitter separated from said base layer stack by a second emitter cap layer of a second effective thickness different to the first effective thickness, wherein the base layer stack of the first type bipolar transistor or the second type bipolar transistor comprises a carbon-doped SiGe layer, and wherein the first emitter cap layers and the second emitter cap layers comprise a Si layer.

* * * * *